(12) United States Patent
Udrea

(10) Patent No.: US 7,381,606 B2
(45) Date of Patent: Jun. 3, 2008

(54) SEMICONDUCTOR DEVICE AND METHOD OF FORMING A SEMICONDUCTOR DEVICE

(75) Inventor: Florin Udrea, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 0 days.

(21) Appl. No.: 11/873,966

(22) Filed: Oct. 17, 2007

(65) Prior Publication Data
US 2008/0070350 A1 Mar. 20, 2008

Related U.S. Application Data

(62) Division of application No. 11/133,445, filed on May 20, 2005, now Pat. No. 7,301,220.

(51) Int. Cl.
*H01L 21/336* (2006.01)
*H01L 21/8234* (2006.01)
*H01L 21/8238* (2006.01)

(52) U.S. Cl. .................. 438/204; 438/197

(58) Field of Classification Search ......... 438/197–212
See application file for complete search history.

(56) References Cited

U.S. PATENT DOCUMENTS

2007/0158678 A1\* 7/2007 Udrea .................. 257/119
2008/0012043 A1\* 1/2008 Udrea et al. .............. 257/343

\* cited by examiner

*Primary Examiner*—Cuong Q Nguyen
(74) *Attorney, Agent, or Firm*—Pillsbury Winthrop Shaw Pittman LLP

(57) ABSTRACT

A bipolar high voltage/power semiconductor device has a low voltage terminal and a high voltage terminal. The device has a drift region of a first conductivity type and having first and second ends. In one example, a region of the second conductivity type is provided at the second end of the drift region connected directly to the high voltage terminal. In another example, a buffer region of the first conductivity type is provided at the second end of the drift region and a region of a second conductivity type is provided on the other side of the buffer region and connected to the high voltage terminal. Plural electrically floating island regions are provided within the drift region at or towards the second end of the drift region, the plural electrically floating island regions being of the first conductivity type and being more highly doped than the drift region.

14 Claims, 12 Drawing Sheets

SEMICONDUCTOR DEVICE AND METHOD OF FORMING A SEMICONDUCTOR DEVICE

CROSS-REFERENCE TO RELATED APPLICATIONS

This application is a divisional application of U.S. patent application Ser. No. 11/133,445, filed May 20, 2005, now U.S. Pat. No. 7,301,220 now allowed, the entire contents of which is incorporated herein by reference.

The present invention relates to a semiconductor device and to a method of forming a semiconductor device.

The present invention is particularly concerned with high voltage semiconductor devices which can be used in smart power or power integrated circuits (ICs) and is particularly concerned with diodes and transistors, such as power diodes, lateral insulated gate bipolar transistors (LIGBTs), power transistors, thyristors or other types of MOS-bipolar devices such as MOS-controlled thyristors.

Power devices operated in integrated circuits typically operate with a voltage in the range 20V to 1.2 kV and typically higher than 30V or 50V or so. Power devices typically operate with a current in the range 10 mA to 50 A and typically higher than 0.1 A and smaller than 5 A. Such devices may also be referred to as "high voltage/power devices". These devices are typically capable of delivering from a few mWatts to 1 Watt or even a few tens of Watts of power. Their application may range from domestic appliances, electric cars, motor control, and power supplies to RF and microwave circuits and telecommunication systems.

It will be appreciated that the terms "top" and "bottom", "above" and "below", and "lateral" and "vertical", may be used in this specification by convention and that no particular physical orientation of the device as a whole is implied.

Lateral devices in integrated circuits have the main terminals (variously called the anode/cathode, drain/source and emitter/collector) and the control terminal(s) (variously called the gate or base) placed at the surface of the device in order to be easily accessible. In power ICs, such devices are often monolithically integrated with CMOS-type or BiCMOS-type low voltage/low power circuits. It is desirable that one or several high voltage/power devices be integrated within the same chip. Low power circuits contained typically CMOS cells such as n-channel and p-channel MOSFETs and in some cases bipolar npn or pnp transistors.

To make the manufacture of power integrated circuits more cost-effective, some of the layers in the power device are formed in the same process step as layers in the low voltage/low power circuits. For example, the source and the drain of the n-channel MOSFETs are formed in the same process step as the source/cathode of the power device. The p-well in the CMOS, where an inverting channel is formed, can be also formed at the same time as the p-well in the power device.

From this it will be understood that where possible, the power device and the low-power circuits (e.g. CMOS cells) use common layers. The drift layer is however specific to power devices and it is commonly built before the CMOS process sequence. This drift layer is in general the most lowly doped layer in the entire power integrated circuit and is responsible for supporting most of the high voltage when the device is blocking the voltage (in the off-state or during turn-off). Its doping is determined by the device rating, the primary parameter being the breakdown voltage.

Bipolar power devices are based on the conductivity modulation concept. At high levels of charge carrier injection, when the current in the device increases, a mobile charge of electrons and holes (which has a significantly higher concentration than the original doping concentration) is built up in the lowly-doped drift region or layer, leading to a sharp increase in the electrical conductivity of the drift layer. This phenomenon is specific to all bipolar power devices, such as diodes, transistors and thyristors and MOS-bipolar devices such as IGBTs.

The mobile charge accumulated in the on-state dictates the on-state/switching performance of the device. In general, a high level of charge leads to reduced on-state losses but increased switching losses. Moreover, the position of charge within the drift layer is also important. In some power devices, such as the LIGBT, a better trade-off can be obtained by reducing the charge at the high voltage terminal end of the drift layer and increasing the charge at the low voltage terminal end of the drift layer. This is because during turn-off, the depletion layer starts forming at the low voltage terminal end of the drift region (where the reverse biased junction is commonly placed) moving gradually in time towards the other end of the drift region. Thus the excess mobile charge formed in the drift region at the low voltage terminal end can be cleared relatively more quickly than the charge formed at the high voltage end of the drift region.

The trade-off between the on-state voltage drop and turn-off losses is commonly done in power devices by adjusting the lifetime of the charge carriers in the whole of the drift layer. This however tends to reduce severely the charge in the whole of the n-drift layer leading to a poor trade-off between on-state losses and switching losses. As already mentioned, a more effective technique is to reduce the charge at the high voltage terminal end of the drift layer while leaving it virtually unaffected (or less affected) at the other end of the drift region. There are two techniques which can deliver this. The first is local lifetime killing and the second is based on changing the injection efficiency of the junction associated with the high voltage terminal (that is for example the anode junction in a IGBT) by changing the doping of the semiconductor layers on either side of the junction. Local lifetime irradiation has been applied with some success in vertical devices. Transparent anodes/emitters (i.e. thin layers with relatively low doping) have also been used to reduce the injection efficiency of the junction. In punch-through vertical IGBTs, the injection efficiency can be modified by changing the doping of the n-buffer layer. This is however difficult to achieve as the n-buffer layer needs to be very highly doped to be efficient.

The techniques described above are applicable to vertical IGBTs but they are limited in use for lateral devices. Lifetime killing (blanket or local) in lateral devices is extremely challenging and can damage the CMOS or Bi-CMOS circuit blocks (typically affecting the threshold voltages or the gain of bipolar transistors). In addition, lifetime killing is not the most effective technique to adjust the trade-off between the on-state and switching losses. Changing the doping of the junction layers can also be very difficult and certainly expensive, because most layers available in a CMOS or bi-CMOS process have doping concentrations dictated by the performance of the CMOS or Bi-CMOS low voltage devices. For example the p+ layer that is used as the anode of the LIGBT (emitter of the pnp transistor) is also used as the source and drain of the p-channel MOS transistor and its doping cannot be changed dramatically to have any effect on the injection efficiency. Similarly, the doping of the n-well which is used as both the substrate of the p-channel MOSFET and the buffer of the IGBT cannot be easily changed to adjust the injection efficiency. Moreover, even if some of these changes can be accommodated by introducing extra processing steps (e.g. by using new masks), every time it is necessary to re-adjust the trade-off between on-state and switching losses in order for the device to operate more efficiently at a different switching frequency, the process has to be re-tailored to allow this change. This is expensive and time consuming and therefore highly undesirable.

According to a first aspect of the present invention, there is provided a bipolar high voltage/power semiconductor device, the device comprising: a low voltage terminal and a high voltage terminal; a drift region of a first conductivity type and having first and second ends; the first end of the drift region having adjacent thereto a region of the first conductivity type connected directly to the low voltage terminal or a region of a second conductivity type connected indirectly via a further region to the low voltage terminal; a region of the second conductivity type at the second end of the drift region connected directly to the high voltage terminal; and, plural electrically floating island regions within the drift region at or towards the second end of the drift region, the plural electrically floating island regions being of the first conductivity type and being more highly doped than the drift region.

According to a second aspect of the present invention, there is provided a bipolar high voltage/power semiconductor device, the device comprising: a low voltage terminal and a high voltage terminal; a drift region of a first conductivity type and having first and second ends; the first end of the drift region having adjacent thereto a region of the first conductivity type connected directly to the low voltage terminal or a region of a second conductivity type connected indirectly via a further region to the low voltage terminal; a buffer region of the first conductivity type at the second end of the drift region; a region of a second conductivity type on the other side of the buffer region and connected to the high voltage terminal such that the buffer region is between the second end of the drift region and said region of the second conductivity type; and, plural electrically floating island regions provided at least partly within the buffer region or at least partly within the drift region at or towards the second end of the drift region, the plural floating regions being of the first conductivity type and being more highly doped than both the drift region and the buffer layer.

In either aspect, the plural electrically floating island regions may be separated from each other by (portions of) the drift region. By "floating" is meant that these regions are not connected directly to a terminal. The plural electrically floating island regions can be seen as multiple highly doped islands placed inside the drift region near or towards the second end of the drift region and/or the buffer region. The region connected to the first end of the drift region can be of the first conductivity type for some devices, such as a high voltage diode. Alternatively, the region connected to the first end of the drift region can be of the second conductivity type for other devices, such as a LIGBT, in which case one or more further regions (of the first and/or second conductivity type) are provided to provide the connection to the low voltage terminal. In this alternative, the region connected to the first end of the drift region provides a control terminal region above which may be placed an insulated gate as known in MOS-controlled devices.

In either aspect, the injection efficiency of the semiconductor junction between the region of the second conductivity type and the second end of the drift region (in the first aspect) or the junction between the region of the second conductivity type and the buffer region (in the second aspect) is adjusted by introducing the plural islands on or close to the drift region/buffer side of the junction. The islands are not connected directly to a terminal and therefore are to be considered electrically floating, their actual potential depending inter alia on the configuration and operating conditions of the device. The presence of the highly doped islands of the first conductivity type permits very fast turn-off with low transient losses. The trade-off between on-state and transient losses can be adjusted efficiently without modifying the fabrication process. A family of power devices that can operate at different frequencies with different power levels can be designed in an optimal way (i.e. with a favourable trade-off between on-state and switching losses) without changing the fabrication process. In this way very fast LIGBTs can be created. In certain embodiments, the buffer can be reduced in length or effectively removed altogether, which leads to a desirable reduction in the area consumption of the device.

The doping of the drift region and/or buffer region (where provided) may be relatively unchanged compared to a similar conventional device without one or more of said islands. However, the effective total charge on the drift region/buffer side of the physical junction is now changed and determined by the total charge, geometry and position of the islands. The injection efficiency of the junction can therefore be adjusted by modifying the geometrical dimension and position of the islands and the distance between the islands.

The junction may be for example an active p+/n junction. The n-side of the junction can be part of the n– drift layer (as in the first aspect) or part of a n– buffer layer (as in the second aspect). The plural electrically floating island regions are in the form of n+ islands inserted within the drift or the buffer region in the proximity of the active p+/n junction. The original doping of the n-buffer and the n– drift layer are unchanged but the effective total charge on the n-side of the physical junction (p+/n) is now changed and determined by the total charge, geometry and position of the n+ islands. The injection efficiency can therefore be adjusted by modifying the geometrical dimensions, positions and the distance between the n+ islands.

In an embodiment, the active p+/n junction is the emitter junction of a pnp transistor as part of an n-channel LIGBT device. By modifying the injection efficiency of the emitter junction of the pnp transistor, the trade-off between the on-state and switching can be changed in a way to balance more optimally the losses in the power integrated circuit. At the same time the breakdown may be affected as the gain of the bipolar pnp transistor is changed. A larger number of n+ islands and/or a smaller space between them leads to a reduction in the gain of the bipolar pnp transistor and therefore an increase in the breakdown voltage.

By spacing the n+ islands appropriately, a field barrier is created during the off-state voltage blocking mode which may prevent the depletion region reaching the p+ emitter and thus avoid the punch-through of the device. The smaller the space between the n+ islands, the more effective the barrier is. Conventionally the field barrier is made of a n– buffer, made of a single layer placed in front of the p+ emitter. Conventionally, the buffer layer should have a well determined length to avoid breakdown via the punch-through mechanism. In embodiments of the present invention, the length of the n– buffer can be reduced (leading to reduction in the active area of the device), or the n– buffer can be completely eliminated and punch-through avoided by spacing appropriately the n+ islands in front of the p+ emitter.

The islands are preferably very highly doped. The current therefore prefers to follow a path between the islands, which leads to a lower injection of mobile carriers of the second conductivity type into the drift region. This serves to lower the amount of charge built up towards the second end of the drift region and thus reduces the time necessary to remove this charge during the turn-off process.

In an embodiment of the second aspect, at least one of the electrically floating island regions is entirely within the buffer region.

In an embodiment of the second aspect, at least one of the electrically floating island regions is entirely within the drift region.

In an embodiment of the second aspect, at least one of the electrically floating island regions is partly within the buffer region and partly within the drift region.

In general, a larger number of islands per unit area and/or a smaller space between them leads to a reduction in the injection efficiency. This leads to a reduction in the excess charge during the on-state which results in faster switching and lower switching losses. On the other hand, a smaller number of islands and/or a larger spacing between them leads to an increase in the injection efficiency and therefore an increase in the excess charge during the on-state, which results in lower on-state losses.

In an embodiment, the device is a lateral device having opposed edges between the active area of the device and any unused area, at least one of the electrically floating island regions being positioned at towards said edges. (The "active area" of the device is area that is used for current conduction. Any "unused area", which may or may not be present, is area that is not used for current conduction and may be isolated from the active area with reverse biased junctions or insulating/dielectric materials or the like.) This positioning of said at least one electrically floating island region locally reduces the injection efficiency of the device and thus lowers the gain of the bipolar component of the device, which in turn reduces the risk of edge breakdown. This is beneficial given that many power devices suffer from edge breakdown.

In embodiments, the power device can be built within a thin layer of semiconductor layer placed above a thin buried insulating layer (as known in for example the silicon-on-insulator (SOI) technology), or placed above a dielectric layer (as known in for example silicon-on-sapphire or silicon-on-diamond technologies), or placed above a thin insulating layer within a membrane (as known in the membrane technology discussed more fully in our WO-A-02/25700, US-B-6703684, US-A-2004-0084752 and US-A-2004-0087065, the entire contents of which are hereby incorporated by reference, and other related patents and patent applications). In these cases, it is preferable that the n+ islands have a depth equal to the depth of the semiconductor layer and thus the bottom of these islands will be in physical contact with the top of the insulating layer or dielectric layer beneath them.

According to a third aspect of the present invention, there is provided a method of forming a bipolar high voltage/power semiconductor device having a low voltage terminal and a high voltage terminal, the method comprising: forming a drift region of a first conductivity type and having first and second ends; forming adjacent the first end of the drift region a region of the first conductivity type connected directly to the low voltage terminal or a region of a second conductivity type connected indirectly via a further region to the low voltage terminal; forming a region of the second conductivity type at the second end of the drift region connected directly to the high voltage terminal; and, forming plural electrically floating island regions within the drift region at or towards the second end of the drift region, the plural electrically floating island regions being of the first conductivity type and being more highly doped than the drift region.

According to a fourth aspect of the present invention, there is provided a method of forming a bipolar high voltage/power semiconductor device having a low voltage terminal and a high voltage terminal, the method comprising: forming a drift region of a first conductivity type and having first and second ends; forming adjacent the first end of the drift region a region of the first conductivity type connected directly to the low voltage terminal or a region of a second conductivity type connected indirectly via a further region to the low voltage terminal; forming a buffer region of the first conductivity type at the second end of the drift region; forming a region of a second conductivity type on the other side of the buffer region and connected to the high voltage terminal such that the buffer region is between the second end of the drift region and said region of the second conductivity type; and, forming plural electrically floating island regions provided at least partly within the buffer region or at least partly within the drift region at or towards the second end of the drift region, the plural floating regions being of the first conductivity type and being more highly doped than both the drift region and the buffer layer.

In a preferred embodiment, the method comprises: forming the plural electrically floating island regions during the same process step already existing in the fabrication process used to form one of the layers. This embodiment means that it is not necessary to resort to using an extra mask and therefore keeps down manufacturing costs. The one of the layers may be one of the highly doped layers. Such layer could be for example the source/drain layer of a low power MOSFET, or a highly doped well, such as a n-well.

In an embodiment, the method comprises: forming the plural electrically floating island regions and the low voltage terminal region(s) during the same process step.

In an embodiment, the method comprises: forming the plural electrically floating island regions during the same process step used to form the source or drain of a low-power/low-voltage MOSFET formed in the same integrated chip as the power/high voltage device.

In a preferred embodiment, the islands are formed in the same process step as the source/cathode of the power device and/or the same process step as the source or the drain of the low-power/low-voltage MOSFET devices within the circuits blocks.

In a preferred embodiment, at least one of the ratio (W/S) of the width of the plural electrically floating island regions to the spacing between the plural electrically floating island regions and the ratio (L/S) of the length of the plural electrically floating island regions to the spacing between the plural electrically floating island regions is set so as to optimise the injection efficiency of the junction at the high voltage terminal.

In a preferred embodiment, at least one of the ratio (W/S) of the width of the plural electrically floating island regions to the spacing between the plural electrically floating island regions and the ratio (L/S) of the length of the plural electrically floating island regions to the spacing between the plural electrically floating island regions is set so as to optimise the trade-off between the on-state losses and the switching losses in the power device.

In a preferred embodiment, at least one of the ratio (W/S) of the width of the plural electrically floating island regions to the spacing between the plural electrically floating island regions and the ratio (L/S) of the length of the plural electrically floating island regions to the spacing between the plural electrically floating island regions is set so as to optimise the breakdown voltage by reducing the gain of the bipolar component.

Although the present specification mainly discusses a p+/n− drift or p+/n− buffer junction, the principles of the present invention are also applicable to n+/p junctions.

Although the present specification mainly discusses a LIGBT (lateral Insulated Gate Bipolar Transistor), the principles of the present invention are also applicable to other lateral devices such as power/high voltage diodes (PIN diodes or Schottky diodes), power (or high voltage) bipolar transistors or thyristors.

Embodiments of the present invention will now be described by way of example with reference to the accompanying drawings, in which:

FIG. 9 shows schematically the operation of plural floating islands to protect the device against punch-through;

Figure 1:
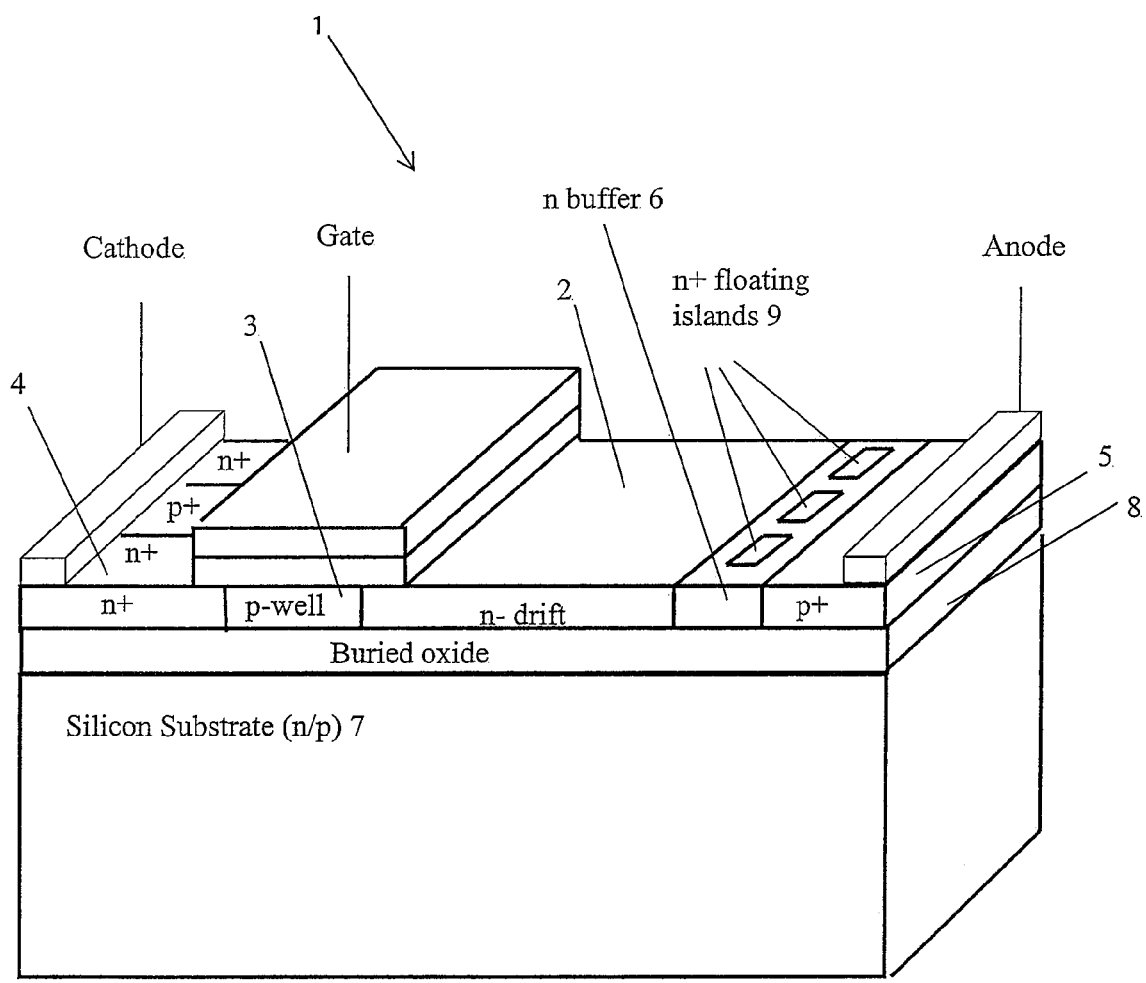
FIG. 1 shows schematically a perspective view of a first example of a lateral insulated gate bipolar transistor (LIGBT) according to an embodiment of the present invention.

Referring now to the drawings, FIG. 1 shows schematically a perspective view of a first example of a high voltage/power lateral insulated gate bipolar transistor (LIGBT) device 1 according to an embodiment of the present invention, this example using thin SOI (Silicon-on-Insulator) technology. The device 1 has a n− drift region 2 having first and second ends. At the first end of the drift region there is p-well region 3 which is further attached to a cathode region 4, which is principally n+ but which may have one or more p+ regions as is known per se as shown, and to which a cathode terminal is fixed in use. MOS gate layers having a gate terminal attached thereto in use are formed over the p− well 3. At the second end of the drift region 2 is a p+ anode region 5 to which an anode terminal is fixed in use. In this example, a n buffer region 6 is provided at the second end of the drift region 2 to separate the drift region 2 from the anode region 5. The active layers and regions described above are formed on a n or p silicon substrate 7 but separated therefrom by a thin buried layer of insulator 8 (silicon oxide in this example) as is known in the SOI technology per se.

Plural n+ floating islands 9 are placed in the n− buffer region. In the preferred embodiment, the n+ islands 9 are formed in the same process step with the n+ cathode region 4 (i.e. the source/cathode) of the device 1. The islands 9 are preferably deep enough to physically reach the top of the buried insulator 8.

Figure 2:
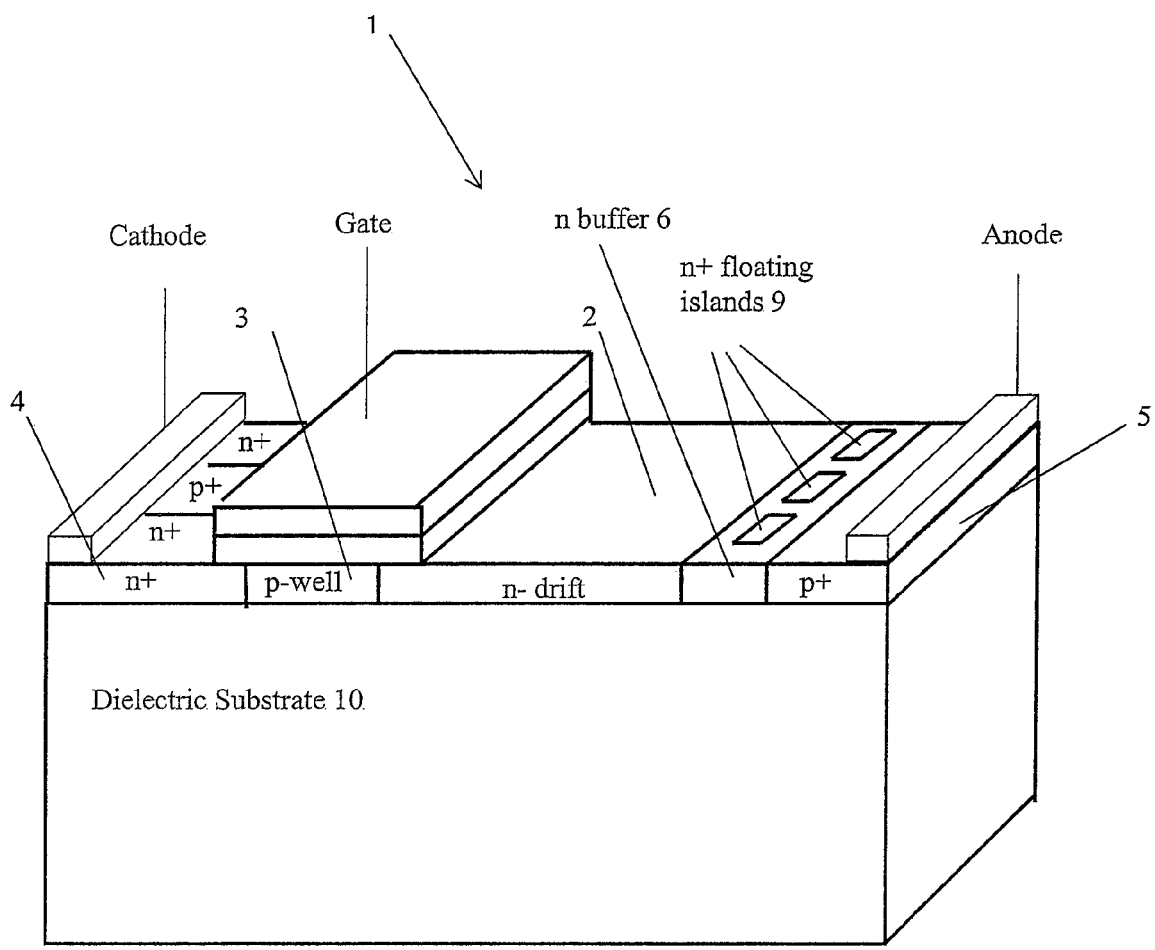
FIG. 2 shows schematically a perspective view of a second example of a LIGBT according to an embodiment of the present invention.

FIG. 2 shows schematically a perspective view of a second example of a high voltage/power lateral insulated gate bipolar transistor (LIGBT) device 1 according to an embodiment of the present invention. Compared to the SOI example of FIG. 1, in the second example a dielectric substrate 10 is provided in place of the silicon substrate 7 and buried oxide layer 8. Other parts are the same and will not be discussed further herein.

Figure 3:
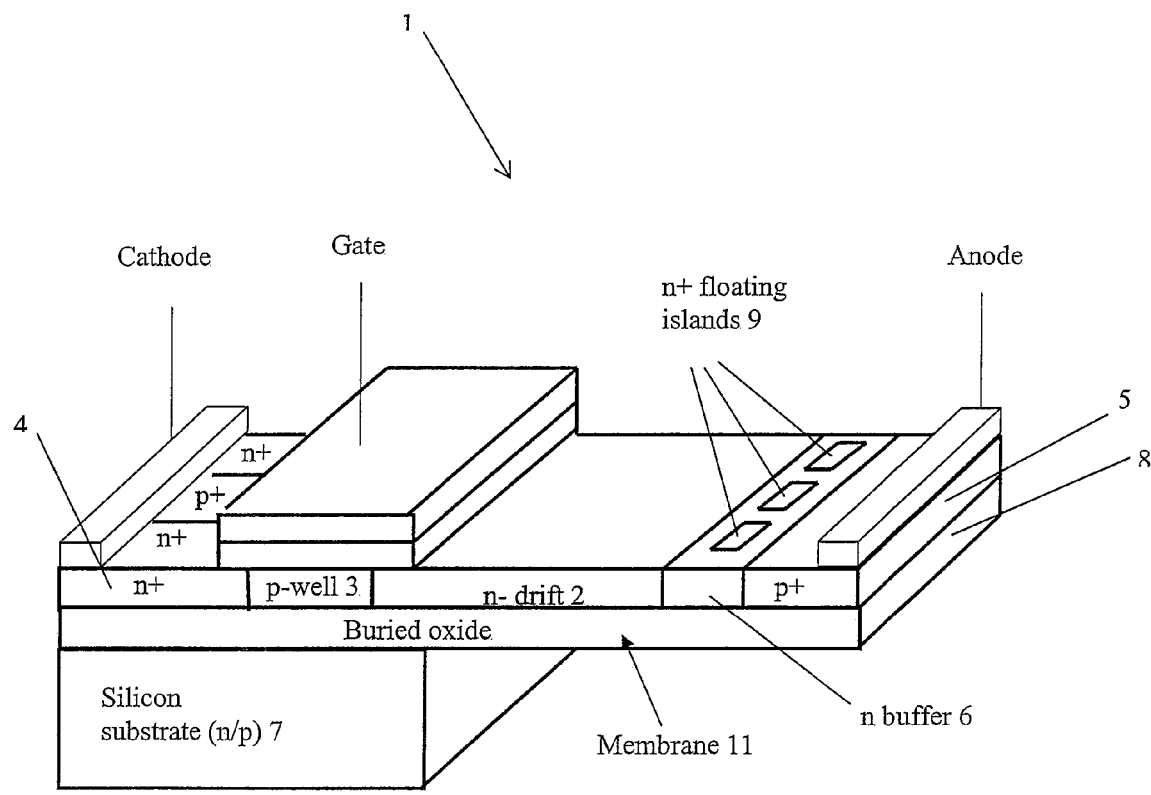
FIG. 3 shows schematically a perspective view of a third example of a LIGBT according to an embodiment of the present invention.

FIG. 3 shows schematically a perspective view of a third example of a high voltage/power lateral insulated gate bipolar transistor (LIGBT) device 1 according to an embodiment of the present invention. This example uses so-called membrane technology in which, compared to the FIG. 1 example, the silicon substrate 7 has been selectively removed or is otherwise selectively absent under the drift region 2 to allow an increase in the breakdown voltage. This membrane is technology described more fully in our WO-A-02/25700, US-B-6703684, US-A-2004-0084752 and US-A-2004-0087065, the entire contents of which are hereby incorporated by reference, and other related patents and patent applications.

Figure 4:
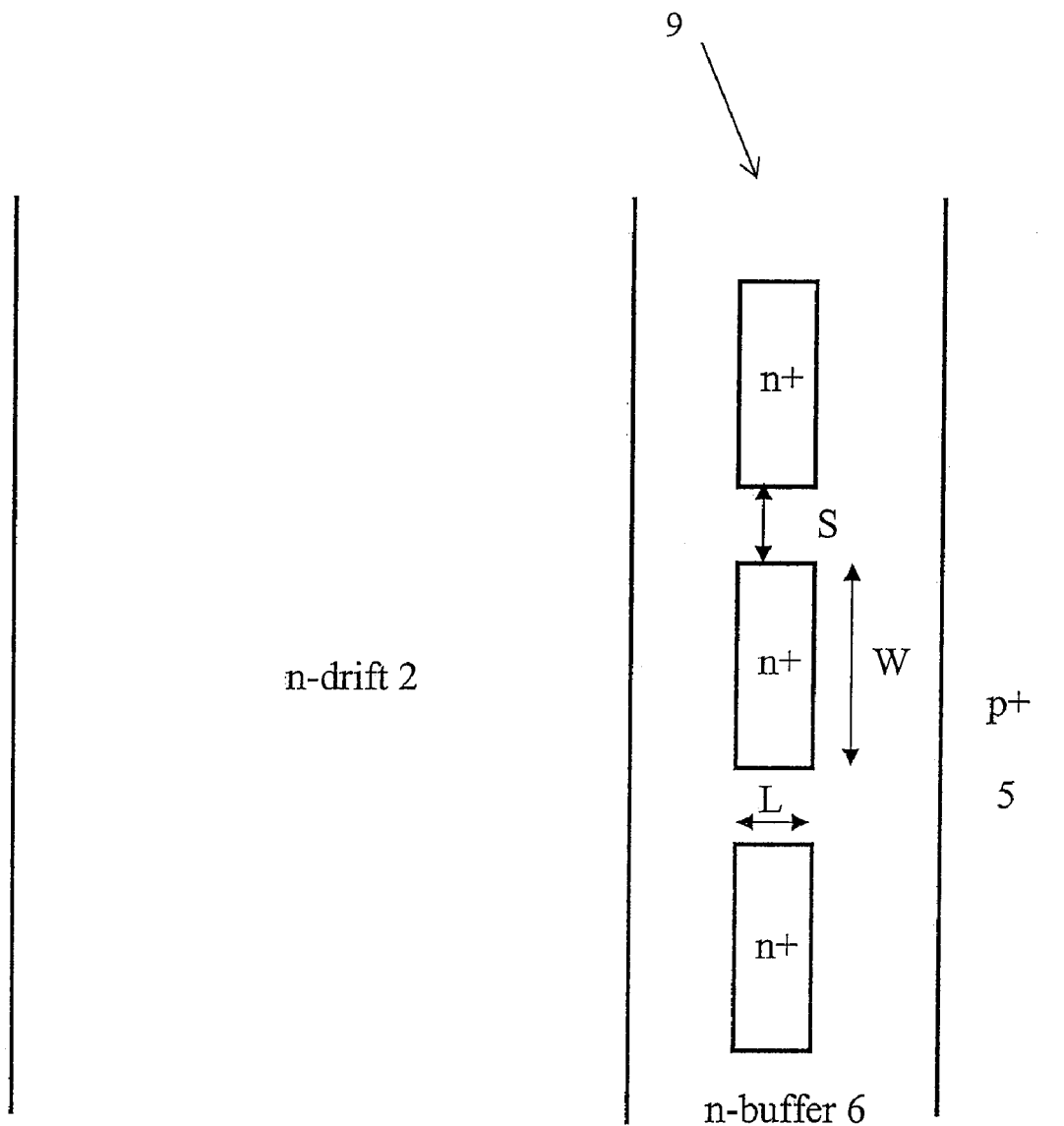
FIG. 4 shows schematically a partial top plan view of the semiconductor surface of the devices shown in FIGS. 1 to 3.

FIG. 4 shows a selective top plan view of the semiconductor surface of the devices 1 shown in FIGS. 1 to 3. This drawing illustrates more clearly the position of the n+ floating islands 9 within the n− buffer 6 and shows the spacing S between two islands 9, the width W of an island 9 and the length L of an island 9. The L/S ratio as well as W/S are important design aspect ratios which adjust the injection efficiency of the junction. A high L/S and/or W/S leads to low injection efficiency.

Examples of doping concentrations will now be given. The drift region 2 is lowly doped, for example in the range of $10^{15}$ cm$^{-3}$ to $10^{16}$ cm$^{-3}$. The n buffer 6 is of "medium" doping, for example in the range of $10^{16}$ cm$^{-3}$ to $10^{17}$ cm$^{-3}$. The p+ anode region 5 is highly doped, for example in the range of $10^{19}$ cm$^{-3}$ to $10^{21}$ cm$^{-3}$. The n+ islands 9 are similarly highly doped, for example in the range of $10^{19}$ cm$^{-3}$ to $10^{21}$ cm$^{-3}$.

As example of dimensions, the drift region 2 can have a length of 40 to 60 microns (for say a 600V device). The buffer 6 can have a length of 4 to 10 microns. The p+ anode region 5 can be 5-10 microns in length. The length L of the islands 9 can be 1 to 2 microns and the width W can be 1 to 5 microns. The spacing S between the islands 9 can be in the range of 1 to 5 microns.

Figure 5:
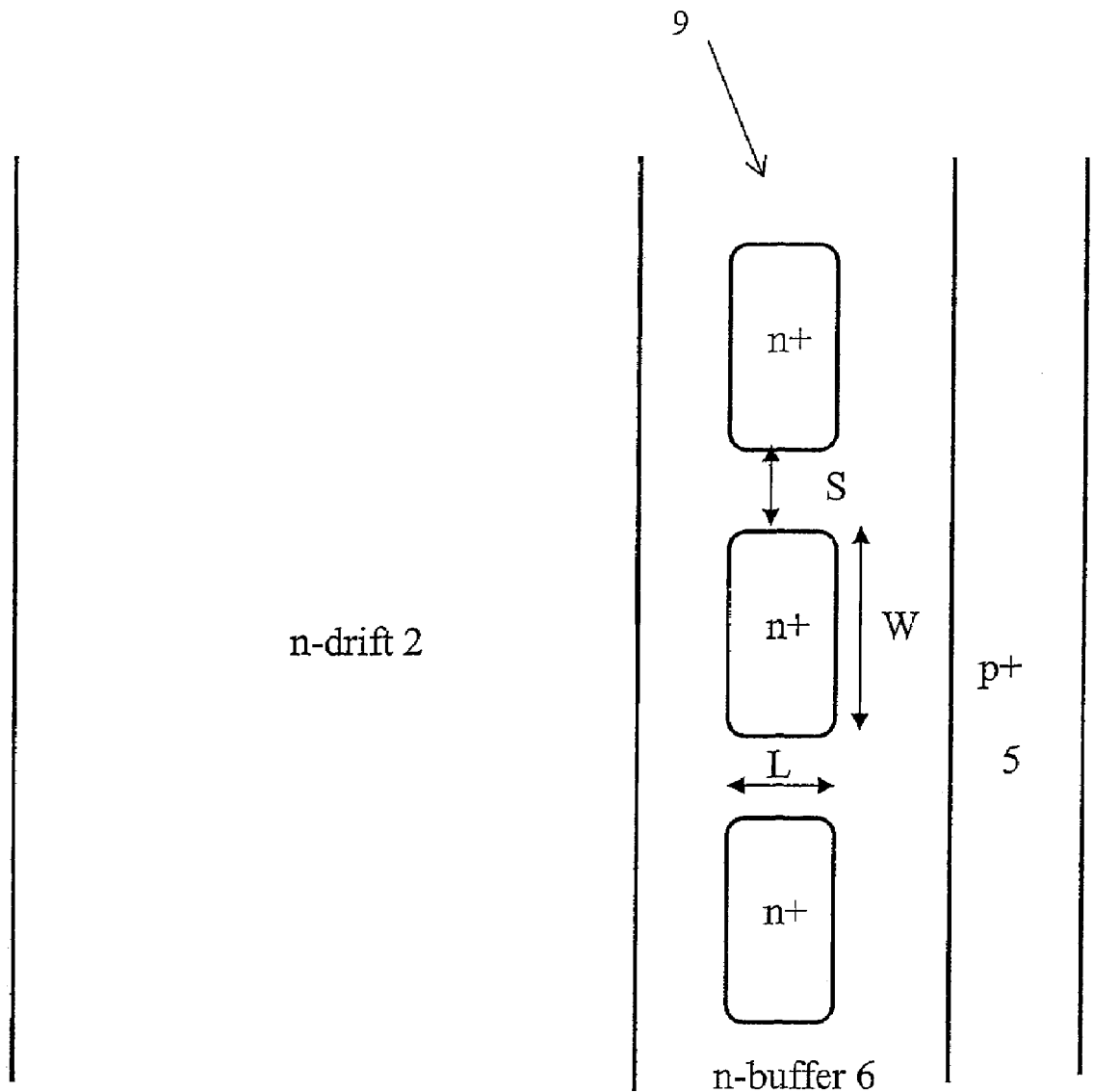
FIGS. 5 to 7 show schematically different shapes, configurations and positions of plural floating islands.
Figure 6:
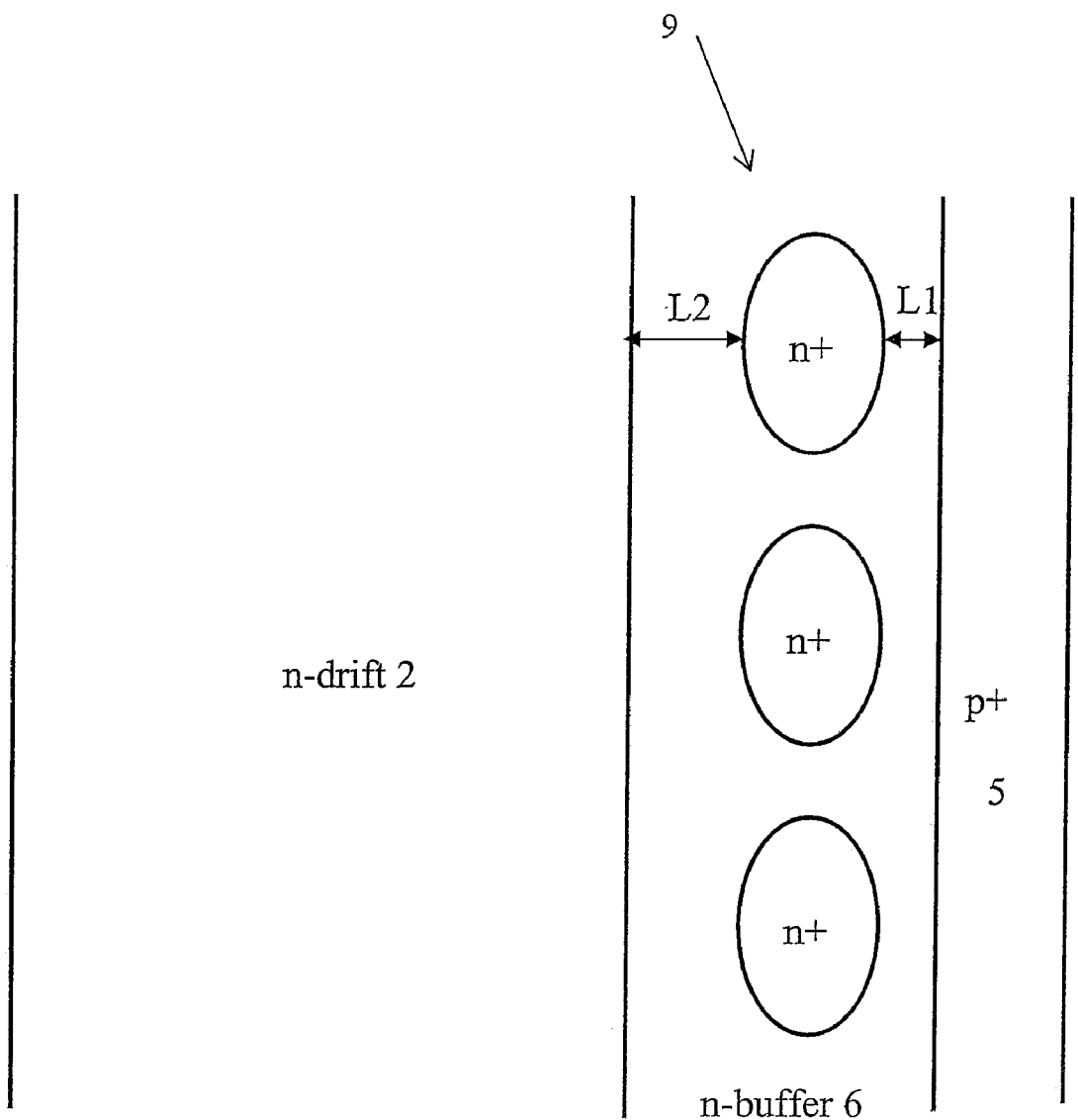

Whereas the islands 9 are shown in FIG. 4 as being rectangular in plan, other shapes are possible. For example, FIG. 5 shows a generally rectangular shape for the islands 9 but with rounded corners. FIG. 6 shows a generally oval shape for the islands 9. Other shapes, such as circular, square, square with rounded corners, elliptical, etc., are feasible.

FIG. 6 also shows how the islands 9 may be asymmetrically disposed in the buffer layer 6 (this being possible in general for any shape of island 9 of course). In FIG. 6, the distance L1 to the P+ anode region 5 is less than the distance L2 to the drift region 2.

Figure 7:
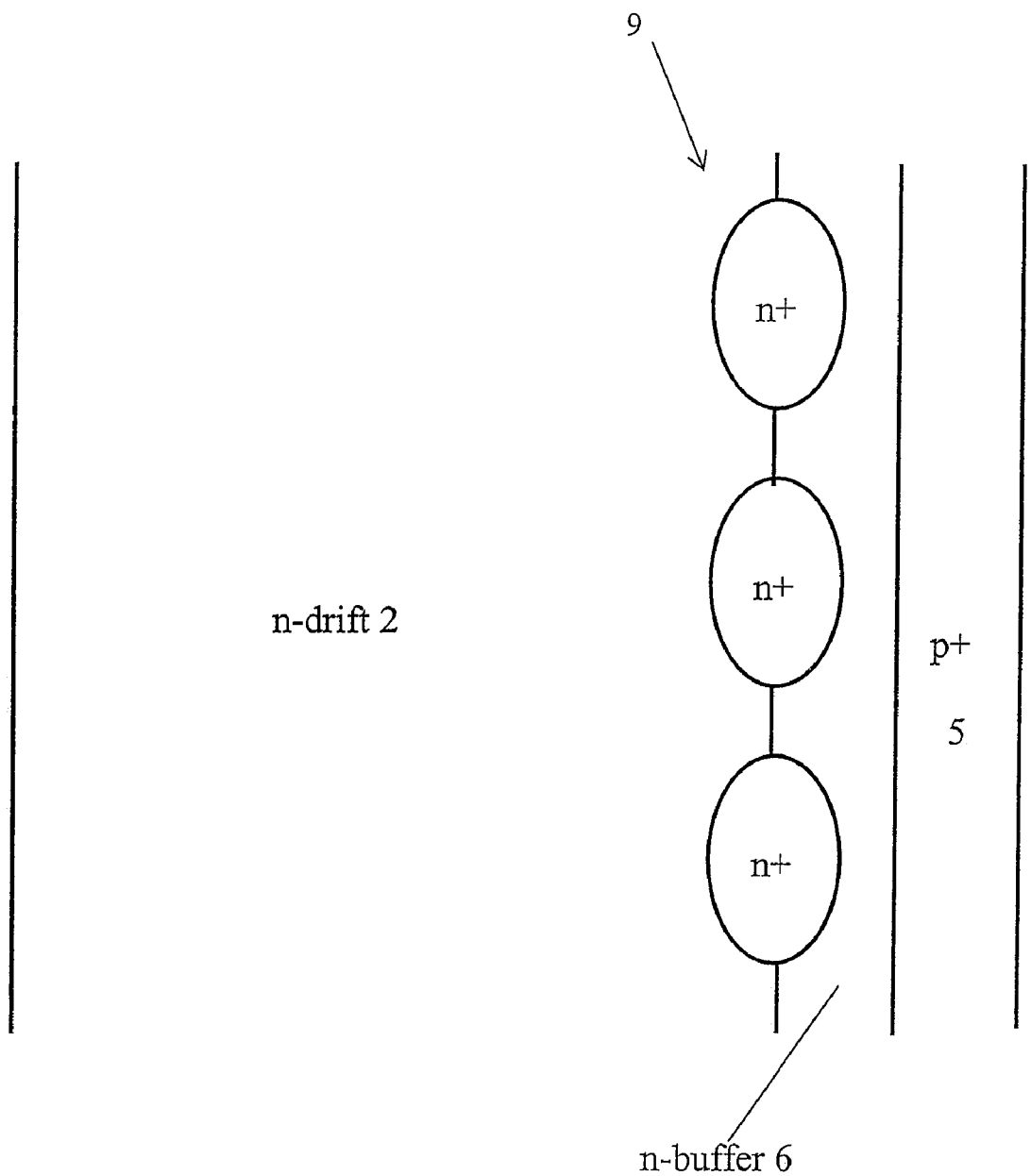

FIG. 7 shows how the islands 9 may be positioned partly within the buffer layer 6 and partly within the drift region 2. Again, this is in general possible for any shape of island 9.

Figure 8:
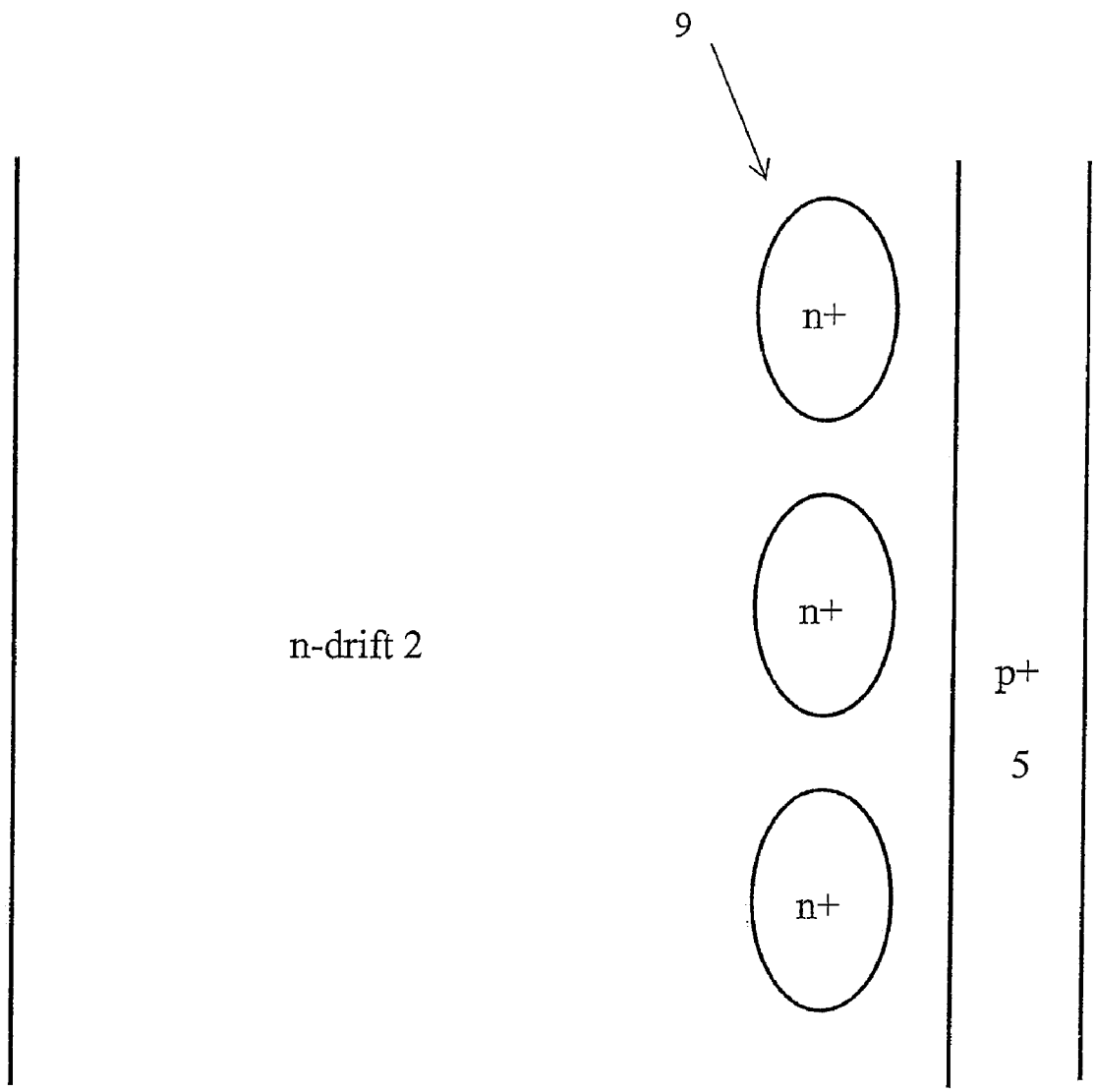
FIG. 8 shows schematically a partial plan view of another example of a device according to an embodiment of the present invention.

FIG. 8 shows schematically the n+ islands 9 being formed entirely within the n− drift region 2. In this example, no n− buffer as such is provided. This device 1 relies on the idea that either the depletion region formed during the blocking mode does not reach the n+ islands 9 or the n+ islands 9 are effective enough to form an electric field barrier to prevent the punch-through of the device 1, and thus the islands 9 provide a buffer effect.

Figure 9:
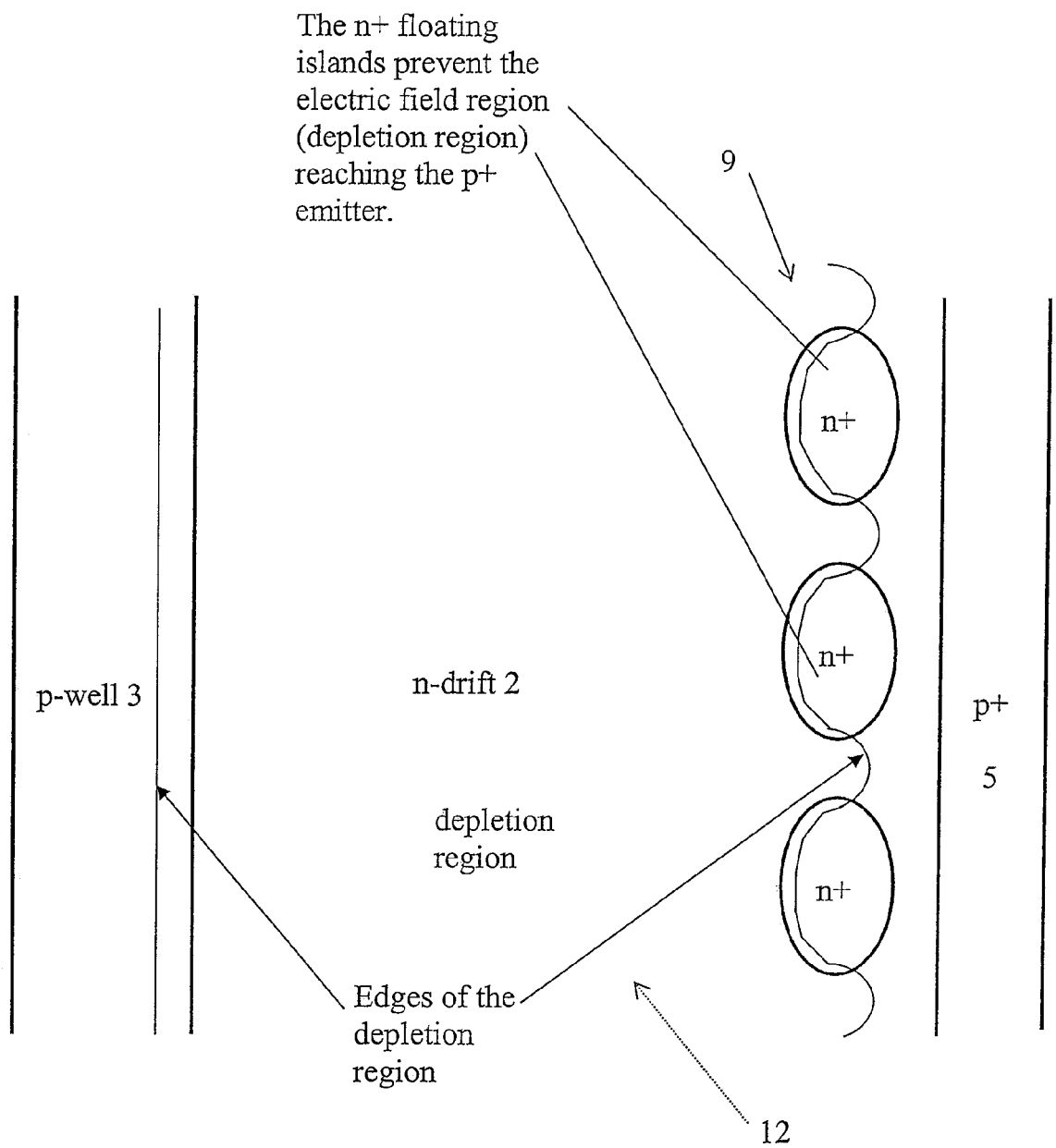

FIG. 9 shows schematically how the n+ floating islands 9 can protect the device 1 against punch-through. In particular, the islands 9 stop the advance of the depletion region 12 towards the p+ emitter region 5 and thus act as a field barrier during the off-state voltage blocking mode. The smaller the distance between the n+ islands 9, the better the field barrier effect is.

Figure 10:
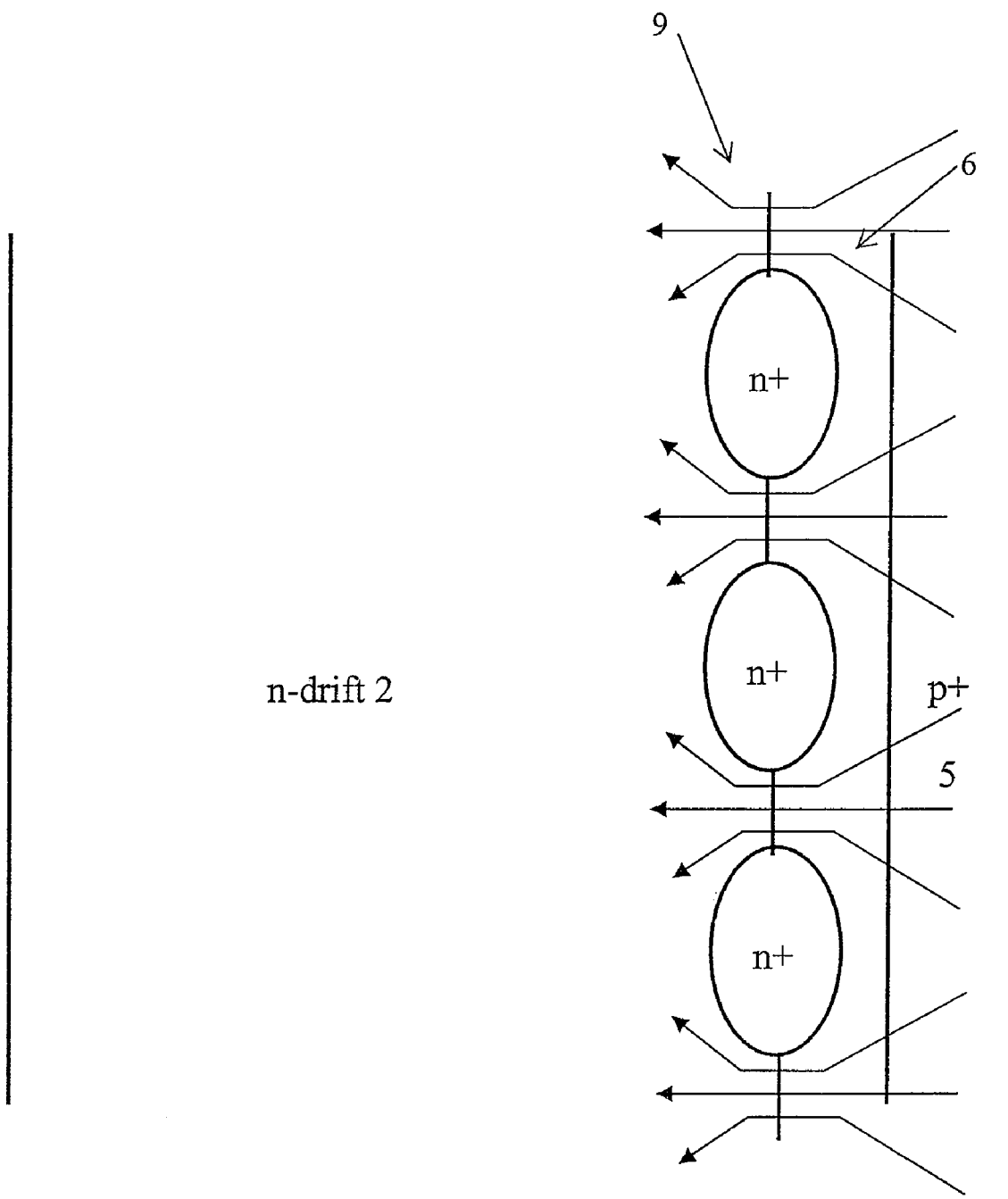
FIG. 10 shows schematically the current injection path during the on-state of an example of a device according to an embodiment of the present invention.

FIG. 10 shows schematically the current injection path during on-state of a device 1 as described above. Since the islands 9 are much more highly doped than the n-buffer 6, the hole injection is mainly through the spacing between each pair of n+ islands 9.

Figure 11:
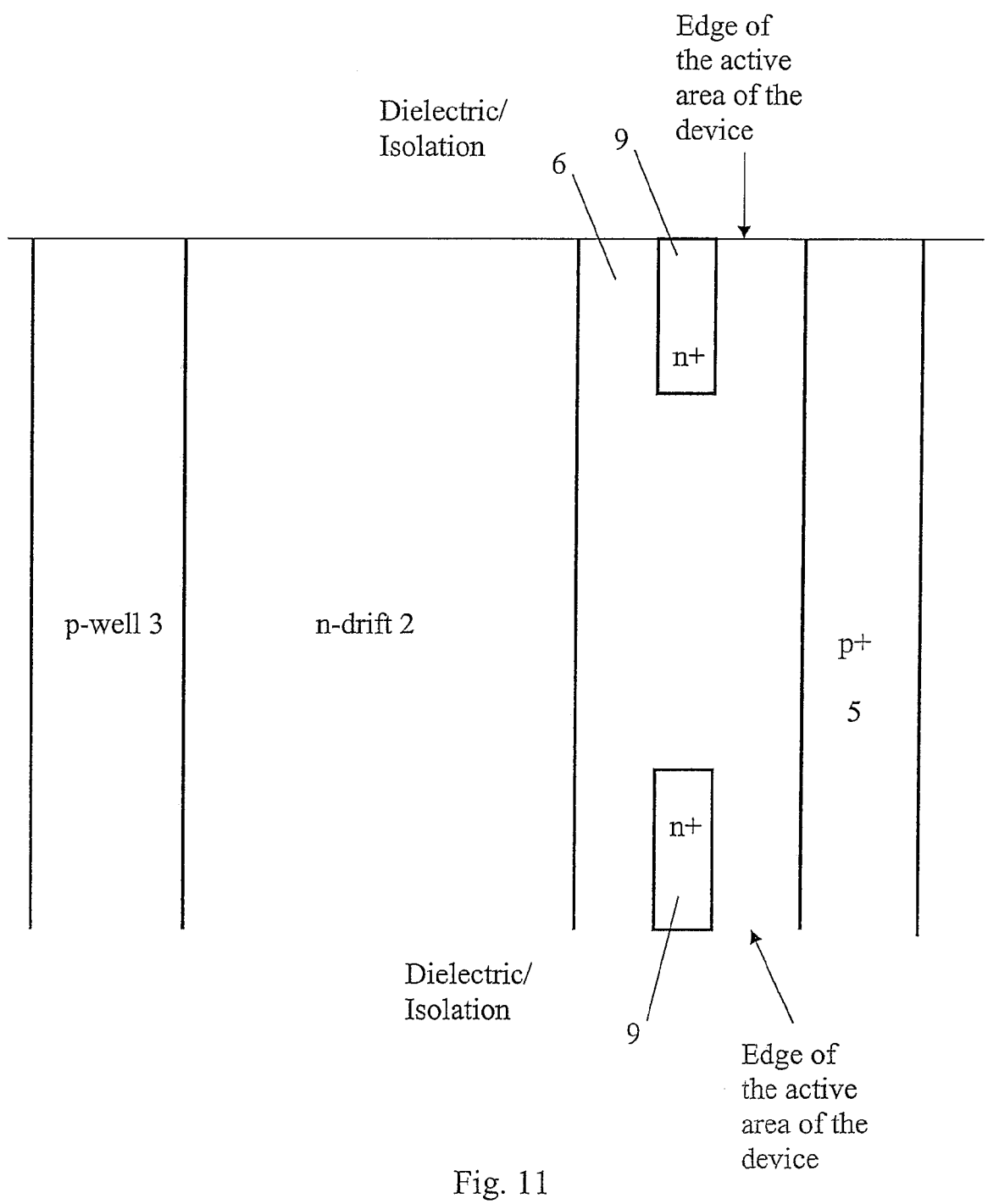
FIG. 11 shows schematically the provision of islands at the edge of an example of a device according to an embodiment of the present invention; and, FIG. 12. shows schematically how the trade-off between the on-state and switching energy losses can be adjusted by changing the width-to-spacing ratio for the islands in a LIGBT.

FIG. 11 shows schematically the provision of n+ islands 9 at the edge of the device 1 (in particular, the active area of the device 1). This is implemented to reduce the risk of edge breakdown, which is achieved by reducing the bipolar gain at the edge of the active area, which in turn increases locally the breakdown strength.

Figure 12:
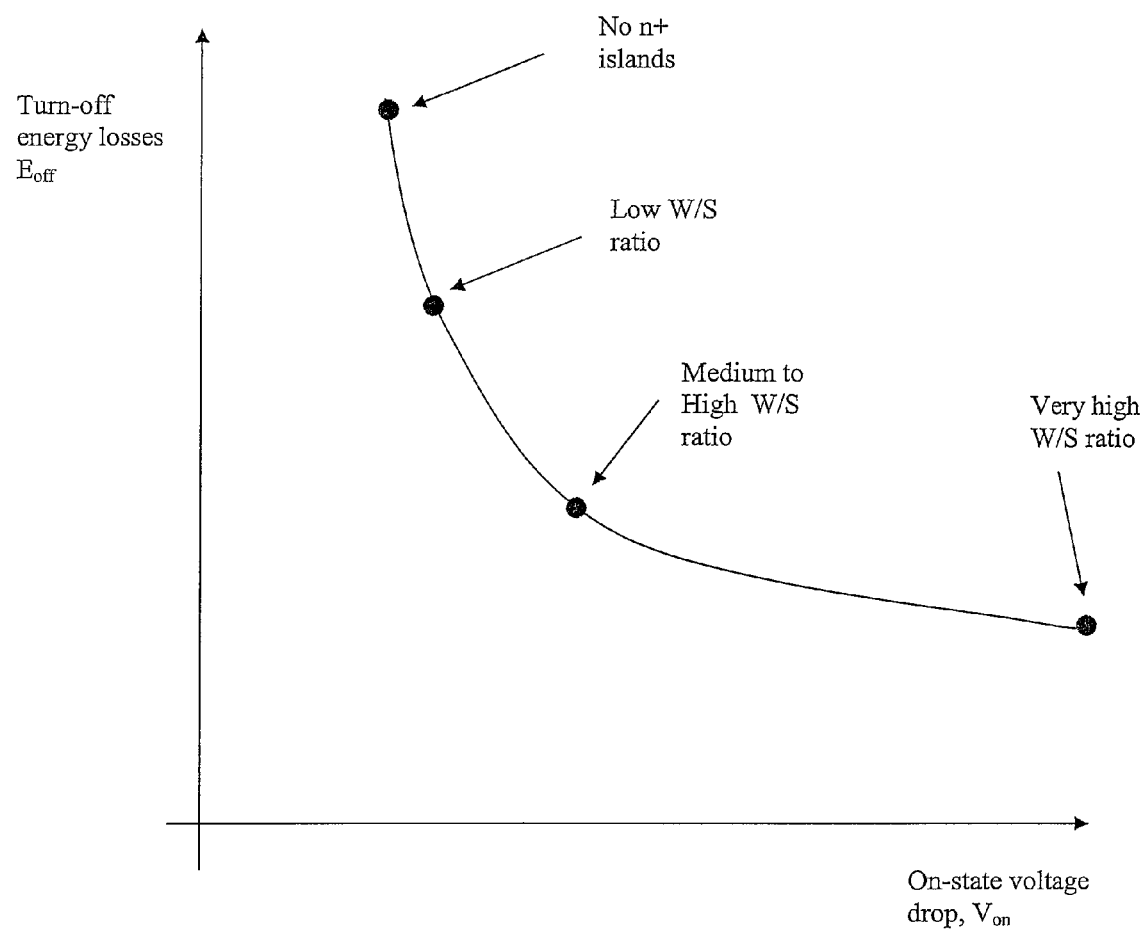

FIG. 12. shows schematically how the trade-off between the on-state and switching energy losses can be adjusted by changing the width-to-spacing W/S ratio for the islands 9 in a LIGBT. For reference, data for a prior art device with no n+ islands is also shown. A high ratio of W/S results in reduced injection efficiency and as a result lower mobile charge and lower turn-off losses. A low ratio W/S results in high conductivity modulation and therefore lower on-state voltage drop at the expense of higher turn-off losses.

In summary, in the preferred embodiments, the injection efficiency is controlled by introducing islands of n+ in the n– drift region or in the n buffer layer. This can be controlled at the level of layout design rather than during the fabrication process. The n+ islands are formed at the same time as the source and drain of the n-channel transistors and therefore they do not require any extra processing. The n+ island step is done within the CMOS or Bi-CMOS process sequence without affecting any CMOS or Bi-CMOS parameters and therefore it can be regarded as CMOS or Bi-CMOS compatible. The dimensions, their actual geometry form (e.g. square, rectangle, oval, etc.), the spacing between them and their relative position to the p+/n physical junction are important parameters, which determine the injection efficiency of the junction. By modifying the injection efficiency of a forward-biased p+/n junction, the excess carrier charge level and its geometrical distribution in the n– drift layer (on the n– side of the junction) is modified. This has a strong impact on the trade-off between the on-state and switching losses.

Embodiments of the present invention have been described with particular reference to the examples illustrated. However, it will be appreciated that variations and modifications may be made to the examples described within the scope of the present invention. For example, as mentioned, although the present specification mainly discusses a p+/n– drift or p+/n buffer junction, the principles of the present invention are also applicable to n+/p junctions.

The invention claimed is:

1. A method of forming a bipolar high voltage/power semiconductor device having a low voltage terminal and a high voltage terminal, the method comprising:

forming a drift region of a first conductivity type and having first and second ends;

forming adjacent the first end of the drift region a region of the first conductivity type connected directly to the low voltage terminal or a region of a second conductivity type connected indirectly via a further region to the low voltage terminal;

forming a region of the second conductivity type at the second end of the drift region connected directly to the high voltage terminal; and, forming plural electrically floating island regions within the drift region at or towards the second end of the drift region, the plural electrically floating island regions being of the first conductivity type and being more highly doped than the drift region.

2. A method according to claim 1, comprising:

forming the plural electrically floating island regions during the same process step already existing in the fabrication process used to form one of the layers.

3. A method according to claim 2, comprising:

forming the plural electrically floating island regions and the low voltage terminal region(s) during the same process step.

4. A method according to claim 2, comprising:

forming the plural electrically floating island regions during the same process step used to form the source or drain of a low-power/low-voltage MOSFET formed in the same integrated chip as the power/high voltage device.

5. A method according to claim 1, wherein at least one of the ratio (W/S) of the width of the plural electrically floating island regions to the spacing between the plural electrically floating island regions and the ratio (L/S) of the length of the plural electrically floating island regions to the spacing between the plural electrically floating island regions is set so as to optimise the injection efficiency of the junction at the high voltage terminal.

6. A method according to claim 1, wherein at least one of the ratio (W/S) of the width of the plural electrically floating island regions to the spacing between the plural electrically floating island regions and the ratio (L/S) of the length of the plural electrically floating island regions to the spacing between the plural electrically floating island regions is set so as to optimise the trade-off between the on-state losses and the switching losses in the power device.

7. A method according to claim 1, wherein at least one of the ratio (W/S) of the width of the plural electrically floating island regions to the spacing between the plural electrically floating island regions and the ratio (L/S) of the length of the plural electrically floating island regions to the spacing between the plural electrically floating island regions is set so as to optimise the breakdown voltage by reducing the gain of the bipolar component.

8. A method of forming a bipolar high voltage/power semiconductor device having a low voltage terminal and a high voltage terminal, the method comprising:

forming a drift region of a first conductivity type and having first and second ends;

forming adjacent the first end of the drift region a region of the first conductivity type connected directly to the low voltage terminal or a region of a second conductivity type connected indirectly via a further region to the low voltage terminal;

forming a buffer region of the first conductivity type at the second end of the drift region;

forming a region of a second conductivity type on the other side of the buffer region and connected to the high voltage terminal such that the buffer region is between the second end of the drift region and said region of the second conductivity type; and, forming plural electrically floating island regions provided at least partly within the buffer region or at least partly within the drift region at or towards the second end of the drift region, the plural floating regions being of the first conductivity type and being more highly doped than both the drift region and the buffer layer.

9. A method according to claim 8, comprising:

forming the plural electrically floating island regions during the same process step already existing in the fabrication process used to form one of the layers.

10. A method according to claim 9, comprising:

forming the plural electrically floating island regions and the low voltage terminal region(s) during the same process step.

11. A method according to claim 9, comprising:

forming the plural electrically floating island regions during the same process step used to form the source or drain of a low-power/low-voltage MOSFET formed in the same integrated chip as the power/high voltage device.

12. A method according to claim 8, wherein at least one of the ratio (W/S) of the width of the plural electrically floating island regions to the spacing between the plural electrically floating island regions and the ratio (L/S) of the length of the plural electrically floating island regions to the spacing between the plural electrically floating island regions is set so as to optimise the injection efficiency of the junction at the high voltage terminal.

13. A method according to claim 8, wherein at least one of the ratio (W/S) of the width of the plural electrically floating island regions to the spacing between the plural electrically floating island regions and the ratio (L/S) of the length of the plural electrically floating island regions to the spacing between the plural electrically floating island regions is set so as to optimise the trade-off between the on-state losses and the switching losses in the power device.

14. A method according to claim 8, wherein at least one of the ratio (W/S) of the width of the plural electrically floating island regions to the spacing between the plural electrically floating island regions and the ratio (L/S) of the length of the plural electrically floating island regions to the spacing between the plural electrically floating island regions is set so as to optimise the breakdown voltage by reducing the gain of the bipolar component.

* * * * *